(12) United States Patent  
Kyono et al.

(10) Patent No.: US 7,554,122 B2
(45) Date of Patent: Jun. 30, 2009

(54) NITRIDE SEMICONDUCTOR LIGHT EMITTING DEVICE, AND METHOD OF FABRICATING NITRIDE SEMICONDUCTOR LIGHT EMITTING DEVICE

(75) Inventors: Takashi Kyono, Itami (JP); Hideki Hirayama, Wako (JP)

(73) Assignees: Sumitomo Electric Industries, Ltd., Osaka (JP); Riken, Saitama (JP)

( * ) Notice: Subject to any disclaimer, the term of this patent is extended or adjusted under 35 U.S.C. 154(b) by 218 days.

(21) Appl. No.: 11/195,871

(22) Filed: Aug. 3, 2005

(65) Prior Publication Data

US 2006/0192218 A1    Aug. 31, 2006

(30) Foreign Application Priority Data

Aug. 3, 2004   (JP)   ............................ P2004-227179

(51) Int. Cl.
  H01L 27/15   (2006.01)
  H01L 29/26   (2006.01)
  H01L 31/12   (2006.01)
  H01L 33/00   (2006.01)

(52) U.S. Cl. ...................................................... 257/79
(58) Field of Classification Search ................. 257/103, 257/E33.028

See application file for complete search history.

(56) References Cited

U.S. PATENT DOCUMENTS 5,828,684 A * 10/1998 Van de Walle ......... 372/45.011
2001/0028064 A1 * 10/2001 Hirayama et al. ............. 257/94
2004/0261692 A1 * 12/2004 Dwilinski et al. ............. 117/84
2005/0087753 A1 * 4/2005 D'Evelyn et al. ............. 257/98

FOREIGN PATENT DOCUMENTS

JP    2001-237455 A    8/2001

OTHER PUBLICATIONS

Chinese Office Action, with English translation, issued in Chinese Patent Application No. CN 200510088496.3, mailed Nov. 9, 2007.

* cited by examiner

Primary Examiner—Jerome Jackson, Jr.
Assistant Examiner—Anthony Ho
(74) Attorney, Agent, or Firm—McDermott Will & Emery LLP

(57) ABSTRACT

In a nitride semiconductor light emitting device, a first conductivity type nitride semiconductor layer is provided on a support base and a second conductivity type nitride semiconductor layer is provided on the support base. An active region is provided between the first conductivity type nitride semiconductor layer and the second conductivity type nitride semiconductor layer. The active region includes an $In_{X1}Al_{Y1}Ga_{1-X1-Y1}N$ well layer ($1>X1>0$ and $1>Y1>0$) and an $In_{X2}Al_{Y2}Ga_{1-X2-Y2}N$ barrier layer ($1>X2>0$ and $1>Y2>0$). An $In_{X3}Al_{Y3}Ga_{1-X3-Y3}N$ buffer layer ($1>X3>0$ and $1>Y3>0$) is provided between the active region and the first conductivity type nitride semiconductor layer. A proportion X1 of indium in the $In_{X1}Al_{Y1}Ga_{1-X1-Y1}N$ well layer is smaller than a proportion X3 of indium in the $In_{X3}Al_{Y3}Ga_{1-X3-Y3}N$ buffer layer, and a proportion X2 of indium in the $In_{X2}Al_{Y2}Ga_{1-X2-Y2}N$ barrier layer is smaller than the proportion X3 of indium in the $In_{X3}Al_{Y3}Ga_{1-X3-Y3}N$ buffer layer.

15 Claims, 11 Drawing Sheets

Fig.5
(A)
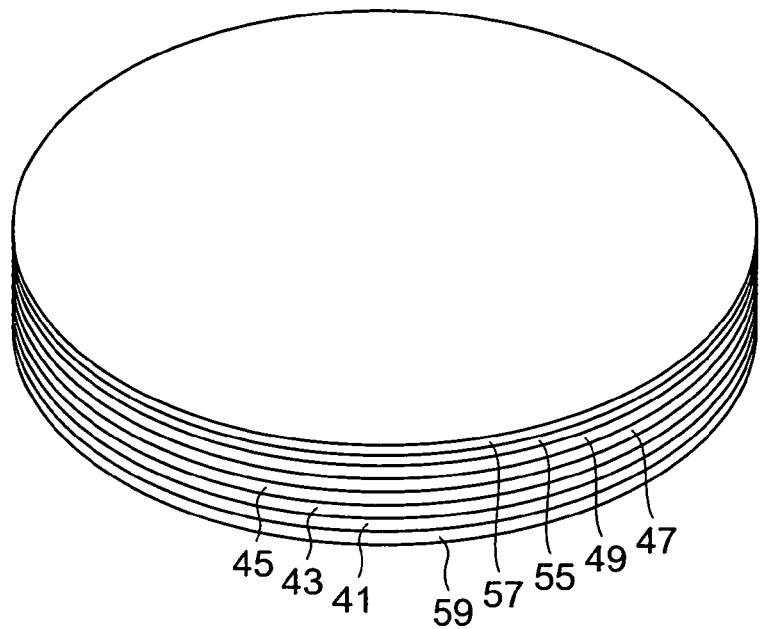
45 43 41 59 57 55 49 47
(B)
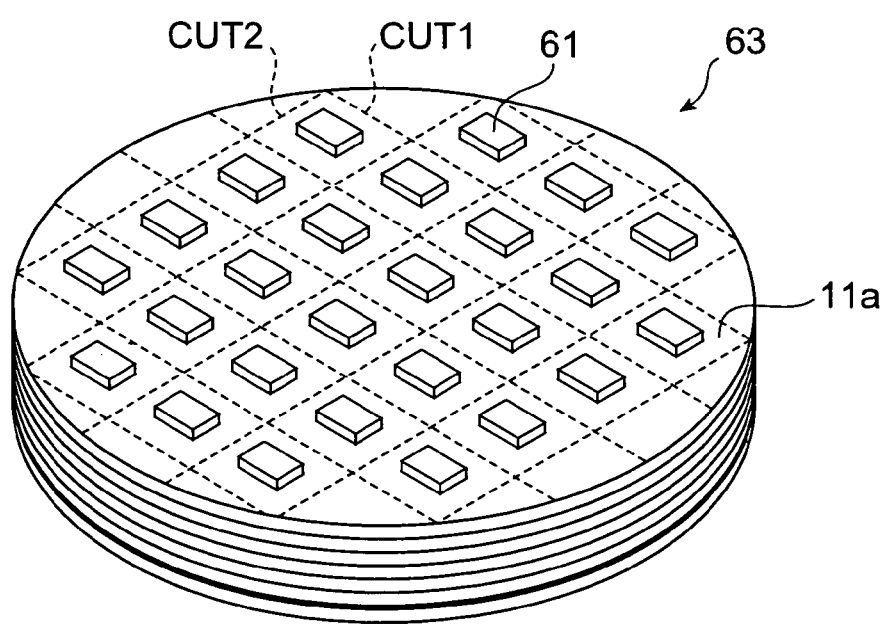

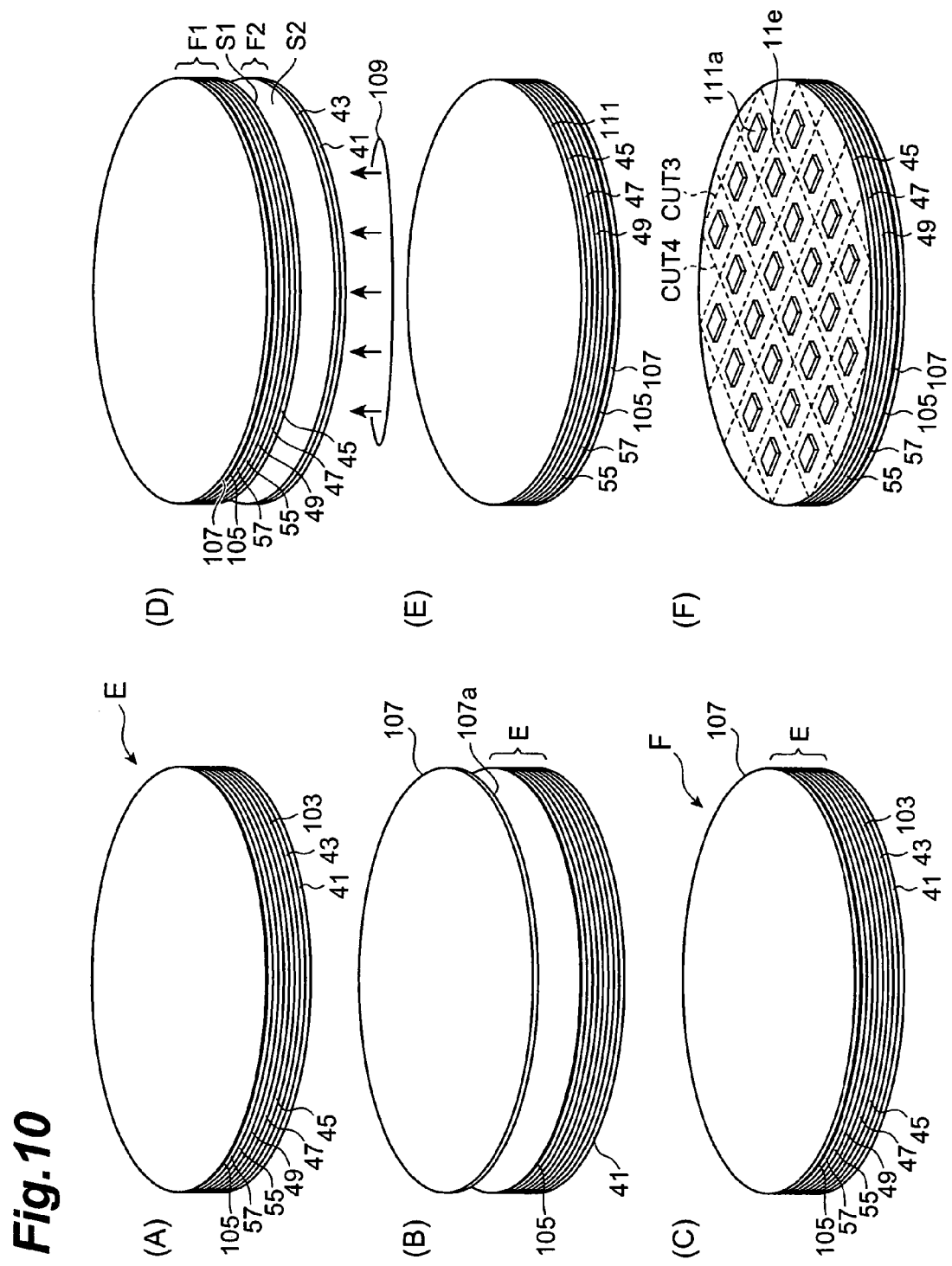

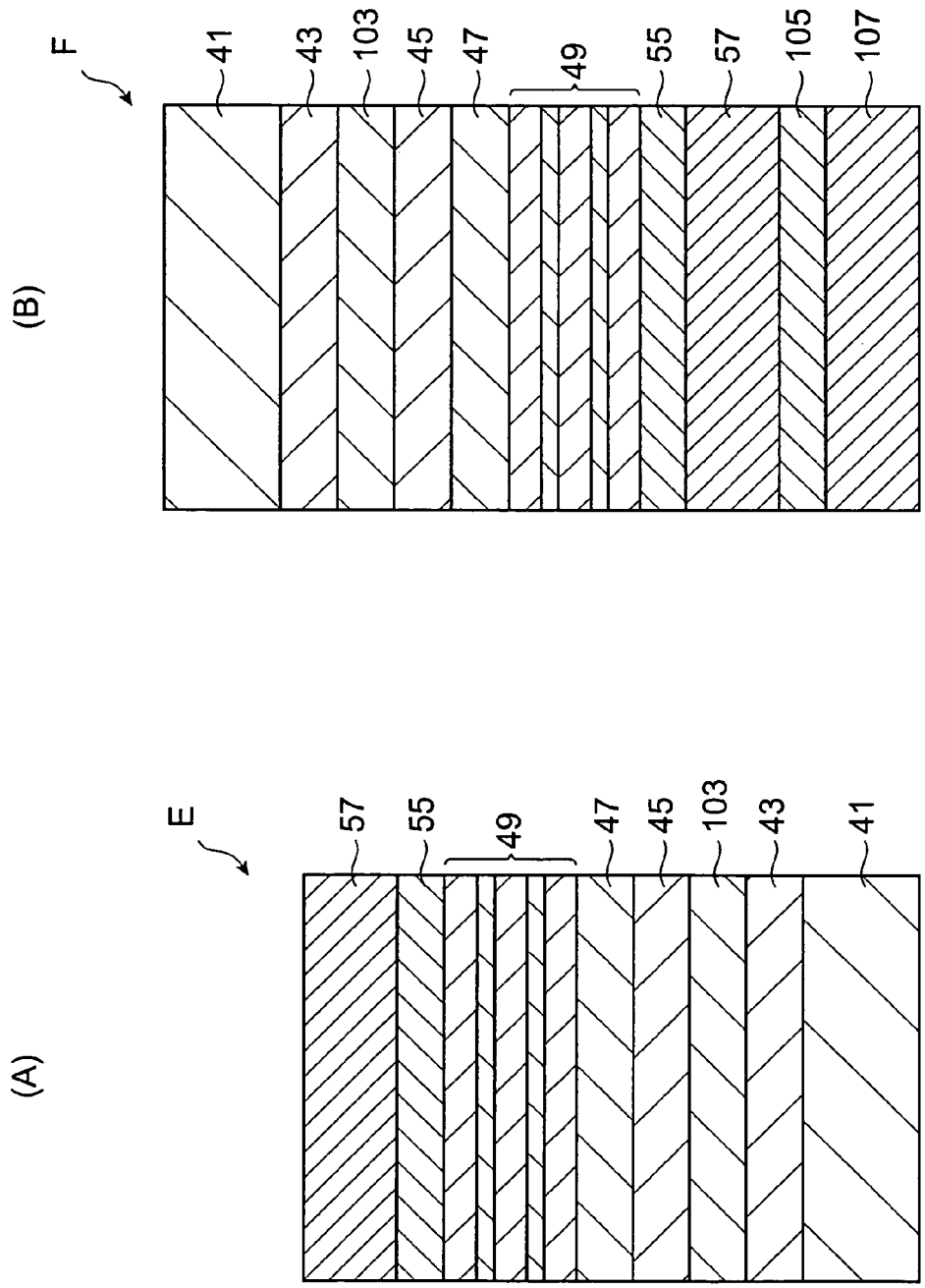

NITRIDE SEMICONDUCTOR LIGHT EMITTING DEVICE, AND METHOD OF FABRICATING NITRIDE SEMICONDUCTOR LIGHT EMITTING DEVICE

BACKGROUND OF THE INVENTION

1. Field of the Invention

The present invention relates to a nitride semiconductor light emitting device, and a method of fabricating the nitride semiconductor light emitting device.

2. Related Background Art

Document 1 (Japanese Patent Application Laid-Open No. 2001-237455) describes an ultraviolet light emitting device. The ultraviolet light emitting device has a quantum well structure including first InAlGaN layers and second InAlGaN layers and the first InAlGaN layers and the second InAlGaN layers are arranged alternately, and InAlGaN is used to emit light of a short wavelength in the ultraviolet region. The composition of the first InAlGaN layers is different from that of the second InAlGaN layers.

SUMMARY OF THE INVENTION

According to the Inventors' knowledge, in a light emitting device having a quantum well structure of both InAlGaN well layers and InAlGaN barrier layers and an InAlGaN buffer layer provided between an n-type AlGaN semiconductor layer and the quantum well structure, if the InAlGaN buffer layer has the same composition as the InAlGaN barrier layers, the emission intensity of the light emitting device is increased.

It is thought that this InAlGaN buffer layer is used for reducing strain that the AlGaN layer applies to the quantum well structure. On an analogy of InGaN-based semiconductors used for emitting light in the visible light region, it is thought that, in terms of increase of emission efficiency, it is preferable that the proportion of indium in the InAlGaN semiconductors for an active region be high in light emitting devices for emitting light in the ultraviolet region. Inventors' experiments show that the InAlGaN buffer layer works well as a strain reducing layer with increased indium proportion in a certain range of the indium proportion.

The inventors' experiments also show that, when a light emitting device has an active region using an InAlGaN semiconductor having an indium proportion smaller than that of another active region that the inventors have used, the emission efficiency of the light emitting device becomes increased and that a proportion of aluminum of the above InAlGaN semiconductor required to obtain the active region for generating light of a desired wavelength becomes smaller as compared to the other active region. When the active region is made of an InAlGaN semiconductor having a small proportion of aluminum, the crystalline quality of the InAlGaN semiconductor in the active region becomes improved because of the smaller adatom migration of aluminum at low temperature, thereby increasing the emission efficiency of the light emitting device.

It is an object of the invention to provide a nitride semiconductor light emitting device which improves its emission efficiency and to provide a method of fabricating the nitride semiconductor light emitting device.

One aspect of the present invention is a nitride semiconductor light emitting device for generating light containing a wavelength component of ultraviolet. This nitride semiconductor light emitting device comprises a first conductivity type nitride semiconductor layer provided on a support base; a second conductivity type nitride semiconductor layer provided on the support base; an active region provided between the first conductivity type nitride semiconductor layer and the second conductivity type nitride semiconductor layer, the active region including an $In_{X1}Al_{Y1}Ga_{1-X1-Y1}N$ well layer (1>X1>0 and 1>Y1>0) and an $In_{X2}Al_{Y2}Ga_{1-X2-Y2}N$ barrier layer (1>X2>0 and 1>Y2 >0); and an $In_{X3}Al_{Y3}Ga_{1-X3-Y3}N$ buffer layer (1>X3>0 and 1>Y3>0) provided between the active region and the first conductivity type nitride semiconductor layer. A proportion X1 of indium in the $In_{X1}Al_{Y1}Ga_{1-X1-Y1}N$ well layer is smaller than a proportion X3 of indium in the $In_{X3}Al_{Y3}Ga_{1-X3-Y3}N$ buffer layer, and a proportion X2 of indium in the $In_{X2}Al_{Y2}Ga_{1-X2-Y2}N$ barrier layer is smaller than the proportion X3 of indium in the $In_{X3}Al_{Y3}Ga_{1-X3-Y3}N$ buffer layer.

In the nitride semiconductor light emitting device according to the present invention, a bandgap energy difference between the $In_{X2}Al_{Y2}Ga_{1-X2-Y2}N$ barrier layer and the $In_{X3}Al_{Y3}Ga_{1-X3-Y3}N$ buffer layer is equal to or lower than $1.92 \times 10^{-20}$ J.

In the nitride semiconductor light emitting device according to the present invention, the proportion X1 of indium in the $In_{X1}Al_{Y1}Ga_{1-X1-Y1}N$ well layer is larger than zero and smaller than 0.03, and the proportion X3 of indium in the $In_{X3}Al_{Y3}Ga_{1-X3-Y3}N$ buffer layer is smaller than 0.10.

In the nitride semiconductor light emitting device according to the present invention, a proportion Y1 of aluminum in the $In_{X1}Al_{Y1}Ga_{1-X1-Y1}N$ well layer is larger than 0.05, the proportion Y1 of aluminum in the $In_{X1}Al_{Y1}Ga_{1-X1-Y1}N$ well layer is smaller than 0.15, and the active region has a quantum well structure for generating light of a wavelength not less than 340 nm nor more than 360 nm.

In the nitride semiconductor light emitting device according to the present invention, a thickness of the $In_{X3}Al_{Y3}Ga_{1-X3-Y3}N$ buffer layer is equal to or more than 10 nm, and the thickness of the $In_{X3}Al_{Y3}Ga_{1-X3-Y3}N$ buffer layer is equal to or less than 100 nm.

In the nitride semiconductor light emitting device according to the present invention, the second conductivity type nitride semiconductor layer has p-conductivity type, the active region has a structure to generate light of a first wavelength, the first wavelength is smaller than a wavelength corresponding to a bandgap energy of GaN, and a bandgap energy of the second conductivity type nitride semiconductor layer is greater than an energy corresponding to the first wavelength.

The nitride semiconductor light emitting device according to the present invention further comprises: one or more first AlGaN semiconductor layers; and one or more second AlGaN semiconductor layers. The conductivity types of the first AlGaN semiconductor layers and the second AlGaN semiconductor layers are one of the following: the first AlGaN semiconductor layers have p-conductivity type; the second AlGaN semiconductor layers have p-conductivity type; the first AlGaN semiconductor layers and the second AlGaN have p-conductivity type. Compositions of the second AlGaN semiconductor layers are different from compositions of the first AlGaN semiconductor layers. The first AlGaN semiconductor layers and the second AlGaN semiconductor layers are arranged to form a superlattice structure. The second conductivity type nitride semiconductor layer is provided between the superlattice structure and the active region. The second conductivity type nitride semiconductor layer has p-conductivity type.

The nitride semiconductor light emitting device according to the present invention further comprises another second conductivity type nitride semiconductor layer provided on the second conductivity type nitride semiconductor layer. The other second conductivity type nitride semiconductor layer has a surface. An electrode is provided on the surface of the other second conductivity type nitride semiconductor layer. Light from the active region is emitted through the surface of the other second conductivity type nitride semiconductor layer. The support base is a sapphire support base. The sapphire support base has a first surface. The first conductivity type nitride semiconductor layer, the active region, the second conductivity type nitride semiconductor layer, and the other second conductivity type nitride semiconductor layer are mounted on the first surface of the sapphire support base. A bandgap energy of the first conductivity type nitride semiconductor layer is larger than an energy corresponding to a wavelength component of the light from the active region.

In the nitride semiconductor light emitting device according to the present invention, the support base is a sapphire support base. A bandgap energy of the first conductivity type nitride semiconductor layer is larger than an energy corresponding to a wavelength component of light from the active region. The sapphire support base has a first surface and a second surface. The first conductivity type nitride semiconductor layer, the active region and the second conductivity type nitride semiconductor layer are mounted on the first surface of the sapphire support base. Light from the active region is emitted through the second surface of the sapphire support base.

The nitride semiconductor light emitting device according to the present invention further comprises another second conductivity type nitride semiconductor layer provided on the second conductivity type nitride semiconductor layer. The other second conductivity type nitride semiconductor layer has a surface. An electrode is provided on the surface of the other second conductivity type nitride semiconductor layer. Light from the active region is emitted through the surface of the other second conductivity type nitride semiconductor layer. The support base is a $Ga_ZAl_{1-Z}N$ (where Z is not less than 0 nor more than 1) support base. The $Ga_ZAl_{1-Z}N$ support base has a surface. The first conductivity type nitride semiconductor layer, the active region, the second conductivity type nitride semiconductor layer, and the other second conductivity type nitride semiconductor layer are mounted on the surface of the $Ga_ZAl_{1-Z}N$ support base.

In the nitride semiconductor light emitting device according to the present invention, the support base is a GaN support base.

In the nitride semiconductor light emitting device according to the present invention, the support base is a $Ga_ZAl_{1-Z}N$ (where Z is not less than 0 and is less than 1) support base. A bandgap energy of the first conductivity type nitride semiconductor layer is larger than an energy corresponding to a wavelength component of the light from the active region. The $Ga_ZAl_{1-Z}N$ support base has a first surface and a second surface. The first conductivity type nitride semiconductor layer, the active region and the second conductivity type nitride semiconductor layer are mounted on the first surface of the $Ga_ZAl_{1-Z}N$ support base. The light from the active region is emitted through the second surface of the $Ga_ZAl_{1-Z}N$ support base.

In the nitride semiconductor light emitting device according to the present invention, the support base is an AlN support base.

In the nitride semiconductor light emitting device according to the present invention, the support base is a metal support base. The first conductivity type nitride semiconductor layer, the active region and the second conductivity type nitride semiconductor layer are mounted on a surface of the metal support base. A bandgap energy of the first conductivity type nitride semiconductor layer is larger than an energy corresponding to a wavelength component of light from active region.

In the nitride semiconductor light emitting device according to the present invention, a bandgap energy of the $In_{X2}Al_{Y2}Ga_{1-X2-Y2}N$ barrier layer is substantially equal to a bandgap energy of the $In_{X3}Al_{Y3}Ga_{1-X3-Y3}N$ buffer layer.

Another aspect of the present invention is a method of fabricating a nitride semiconductor light emitting device for generating light containing a wavelength component in the ultraviolet region. This method comprises: forming a first conductivity type nitride semiconductor film on a substrate; forming a buffer film on the first conductivity type nitride semiconductor film; forming a well film for an active region; forming a barrier film for the active region; and forming a second conductivity type nitride semiconductor film on the active region. The well film includes an $In_{X1}Al_{Y1}Ga_{1-X1-Y1}N$ (1>X1>0 and 1>Y1>0) semiconductor film. The $In_{X1}Al_{Y1}Ga_{1-X1-Y1}N$ semiconductor film is formed at a first temperature. The barrier film includes an $In_{X2}Al_{Y2}Ga_{1-X2-Y2}N$ (1>X2>0 and 1>Y2>0) semiconductor film. The $In_{X2}Al_{Y2}Ga_{1-X2-Y2}N$ semiconductor film is formed at a second temperature. The buffer film includes an $In_{X3}Al_{Y3}Ga_{1-X3-Y3}N$ (1>X3>0 and 1>Y3>0) buffer film. The $In_{X3}Al_{Y3}Ga_{1-X3-Y3}N$ buffer film is formed at a third temperature prior to forming the active region. The first and second temperatures are higher than the third temperature.

The method according to the present invention further comprises the steps of: bonding one of the second conductivity type nitride semiconductor film and a metal substrate to the other; and, after the bonding, separating one of the substrate and the first conductivity type nitride semiconductor film from the other. The substrate is a GaN substrate.

The method according to the present invention further comprises the steps of: prior to forming the first conductivity type nitride semiconductor film on the substrate, forming a sacrifice film on the substrate; and, after forming the second conductivity type nitride semiconductor film on the active region, lifting off the substrate from the first conductivity type nitride semiconductor film by use of the sacrifice film.

BRIEF DESCRIPTION OF THE DRAWINGS

The above objects and other objects, features, and advantages of the present invention will be understood easily from the following detailed description of the preferred embodiments of the present invention with reference to the accompanying drawings.

FIG. 5 is a view showing steps of fabricating a nitride semiconductor light emitting device.

FIG. 10 is a view showing steps of fabricating a nitride semiconductor light emitting device.

FIG. 11 is a view showing steps of fabricating a nitride semiconductor light emitting device.

DETAILED DESCRIPTION OF THE PREFERRED EMBODIMENTS

The teachings of the present invention will readily be understood in view of the following detailed description with reference to the accompanying drawings illustrated by way of example. Referring to the accompanying drawings, embodiments of nitride semiconductor light emitting devices according to the present invention and the method of fabricating the same will be explained. When possible, parts identical to each other will be referred to with symbols identical to each other.

First Embodiment

Figure 1:
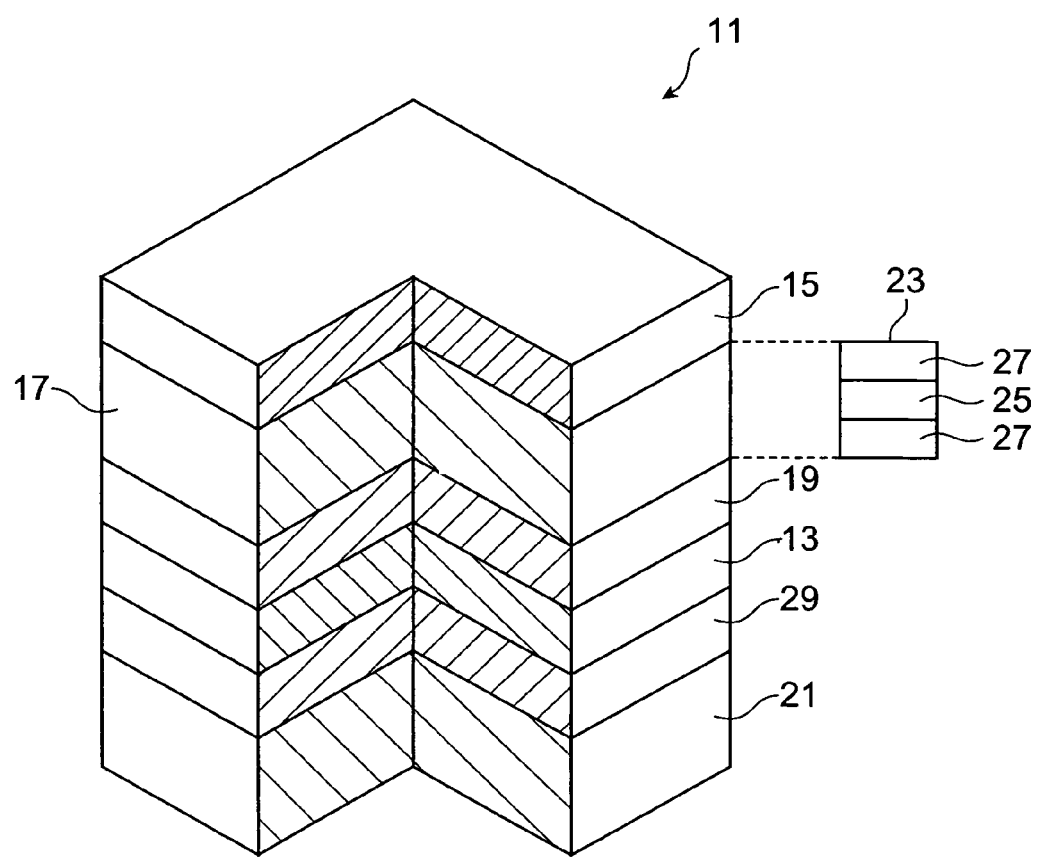
FIG. 1 is a view showing a nitride semiconductor light emitting device according to the first embodiment.

FIG. 1 is a view showing a nitride semiconductor light emitting device according to the first embodiment. This nitride semiconductor light emitting device 11 has a first conductivity type nitride semiconductor layer 13, a second conductivity type nitride semiconductor layer 15, an active region 17, and a buffer layer 19. The first conductivity type nitride semiconductor layer 13 and the second conductivity type nitride semiconductor layer 15 are provided on a support base 21. The active region 17 is provided between the first conductivity type nitride semiconductor layer 13 and the second conductivity type nitride semiconductor layer 15 and is made of InAlGaN semiconductor. In a preferred example, the active region 17 has a quantum well structure 23 and this quantum well structure 23 includes one or more $In_{X1}Al_{Y1}Ga_{1-X1-Y1}N$ well layers 25 (1>X1>0 and 1>Y1>0) and a plurality of $In_{X2}Al_{Y2}Ga_{1-X2-Y2}N$ barrier layers 27 (1>X2>0 and 1>Y2>0). Each well layer 25 is provided between the barrier layers 27. The buffer layer 19 is provided between the first conductivity type nitride semiconductor layer 13 and the active region 17, and is made of an $In_{X3}Al_{Y3}Ga_{1-X3-Y3}N$ (1>X3>0 and 1>Y3>0) semiconductor. The proportion X1 of indium in each $In_{X1}Al_{Y1}Ga_{1-X1-Y1}N$ well layer 25 is smaller than the proportion X3 of indium in the $In_{X3}Al_{Y3}Ga_{1-X3-Y3}N$ buffer layer 19. The proportion X2 of indium in each $In_{X2}Al_{Y2}Ga_{1-X2-Y2}N$ barrier layer 27 is smaller than the proportion X3 of indium in the $In_{X3}Al_{Y3}Ga_{1-X3-Y3}N$ buffer layer 19.

In this nitride semiconductor light emitting device 11, since the indium proportion X3 of the buffer layer 19 is larger than the indium proportion X1 of the well layers 25 and the indium proportion X2 of the barrier layers 27, the buffer layer 19 demonstrates excellent strain reducing performance. Since the indium proportion X1 of the well layers 25 and the indium proportion X2 of the barrier layers 27 are smaller than the indium proportion X3 of the buffer layer 19, the active region 17 has excellent crystalline quality. Accordingly, the emission efficiency of the nitride semiconductor light emitting device according to the present embodiment is increased.

In a preferred example, the first conductivity type nitride semiconductor layer 13 has n-conductivity type. The nitride semiconductor light emitting device 11 includes a nitride layer 29 provided between the support base 21 and the first conductivity type nitride semiconductor layer 13. The support base 21 can be made, for example, of sapphire, a III-nitride, or the like. The nitride layer 29 can be made, for example, of GaN semiconductor. For example, the nitride semiconductor light emitting device 11 in an example can generate light containing a wavelength component in the ultraviolet light region and the quantum well structure 23 of the active region 17 preferably generates light of a wavelength of not more than 360 nm.

Figure 2:
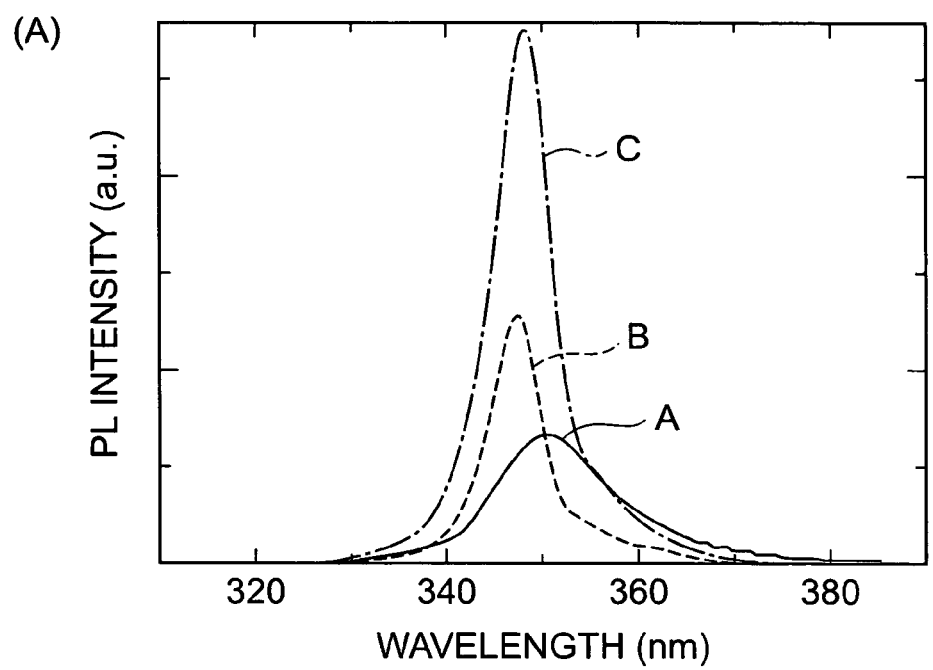
FIG. 2 shows photoluminescence spectra A, B, and C of nitride semiconductor light emitting devices, and indium proportions of barrier layers and a buffer layer for each of the photoluminescence spectra A, B, and C.

Area (A) of FIG. 2 is a view showing photoluminescence wavelength spectra for three nitride semiconductor light emitting devices. The horizontal axis indicates wavelength (nm) and the vertical axis photoluminescence intensity (arbitrary unit). Area (B) of FIG. 2 is a view showing the indium proportions of the barrier layers and buffer layer corresponding to the three photoluminescence spectra A, B, and C.

The nitride semiconductor light emitting devices A, B, and C each has a single quantum well structure using an undoped cap layer instead of the second conductivity type nitride semiconductor layer 15, and has the following structure:

first conductivity type nitride semiconductor layer 13:
  Si-doped n-type $Al_{0.18}Ga_{0.82}N$, 30 nm, formed at 1080° C.;
cap layer:
  undoped $Al_{0.18}Ga_{0.82}N$, 10 nm, formed at 1030° C.;
active region 17: InAlGaN,
  well layers, 2.7 nm
  barrier layers ($In_{U1}Al_{U2}Ga_{1-U1-U2}N$), 15 nm;
buffer layer 19:
  $In_{V1}Al_{V2}Ga_{1-V1-V2}N$, 35 nm;
support base 21:
  sapphire, cleaned with $H_2$ at 1100° C. for ten minutes;
nitride layer 29:
  GaN semiconductor, 25 nm, formed at 475° C.
  Si-doped n-type GaN semiconductor, 3.5 μm, formed at 1080° C.

The InAlGaN semiconductor of the indium proportion of 0.05 is grown, for example, at 780° C., and the InAlGaN semiconductor of the indium proportion of 0.02, for example, at 830° C. Preferably, the indium proportion of the barrier layers is approximately equal to the indium proportion of the well layers. The bandgaps of the barrier layers and buffer layer are, for example, 3.76 eV ($6.02 \times 10^{-19}$ J, note: 1 eV is equal to $1.6 \times 10^{-19}$ J). The aluminum proportions of the well layers in the nitride semiconductor light emitting devices A, B, and C are so adjusted that the emission wavelength is approximately 350 nm.

As shown in area (A) of FIG. 2, the peak intensity of the nitride semiconductor light emitting device B (U1=0.02 and V1=0.02) is approximately 1.8 times the peak intensity of the nitride semiconductor light emitting device A (U1=0.05 and V1=0.05). The peak intensity of the nitride semiconductor light emitting device C (U1=0.02 and V1 =0.05) is approximately 2.3 times the peak intensity of the nitride semiconductor light emitting device B. These spectral intensity measurement results show that the combination of the active region 17 of a lower indium proportion with the buffer layer 19 of a higher indium proportion has the best emission characteristics.

Second Embodiment

Figure 3:
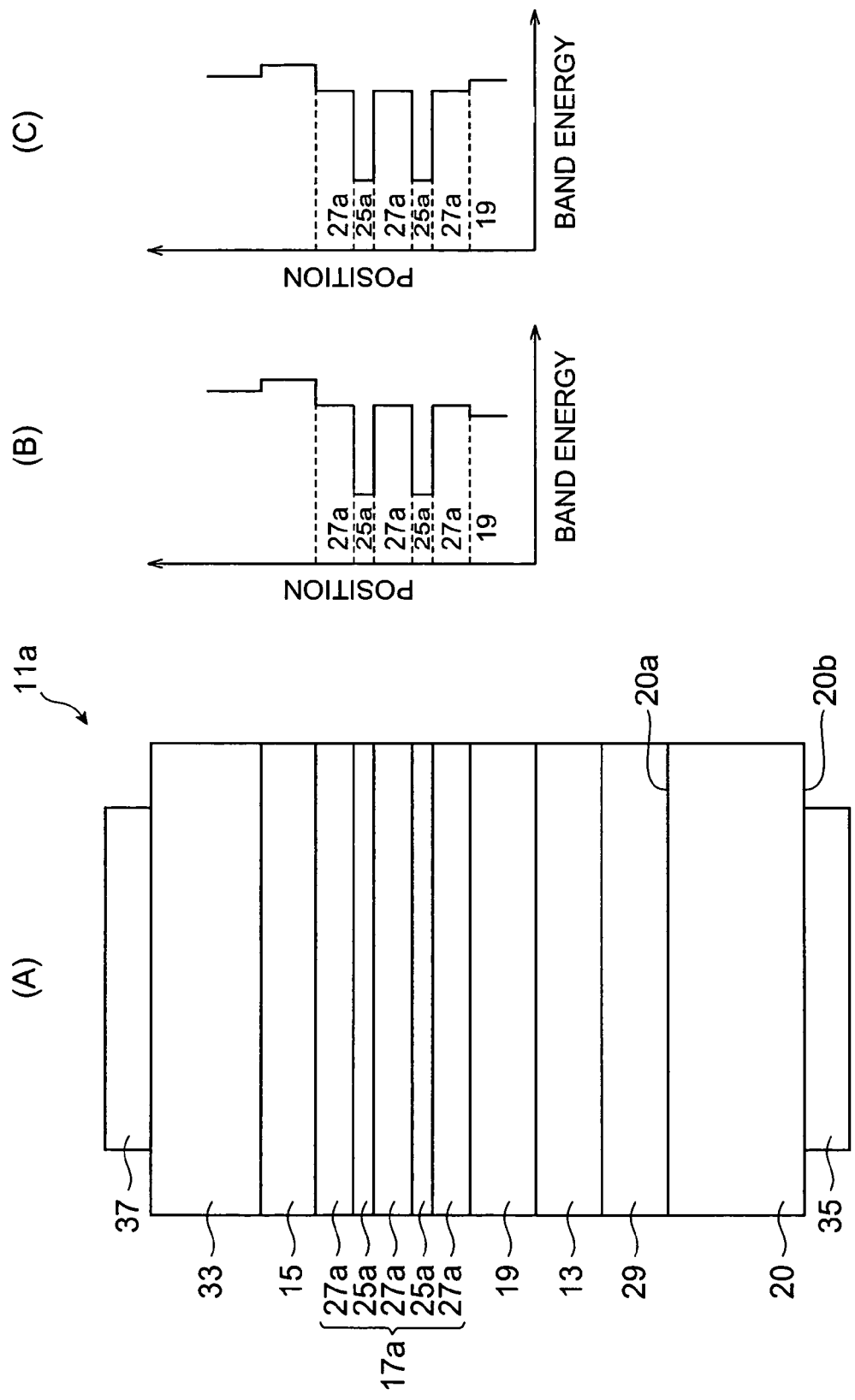
FIG. 3 is a view showing a nitride semiconductor device according to the second embodiment and band diagrams for the nitride semiconductor light emitting device.

Area (A) of FIG. 3 is a view showing a nitride semiconductor device according to the second embodiment. The nitride semiconductor device 11a has an active region 17a provided between first conductivity type nitride semiconductor layer 13 and second conductivity type nitride semiconductor layer 15. The buffer layer 19 is provided between first conductivity type nitride semiconductor layer 13 and active region 17a and is made of an $In_{X3}Al_{Y3}Ga_{1-X3-Y3}N$ (1>X3>0 and 1>Y3>0) semiconductor. As in the case of the nitride semiconductor light emitting device 11 of the first embodiment, the proportion X1 of indium in $In_{X1}Al_{Y1}Ga_{1-X1-Y1}N$ well layers 25a is smaller than the proportion X3 of indium in the $In_{X3}Al_{Y3}Ga_{1-X3-Y3}N$ buffer layer 19. The proportion X2 of indium in $In_{X2}Al_{Y2}Ga_{1-X2-Y2}N$ barrier layers 27a is smaller than the proportion X3 of indium in the $In_{X3}Al_{Y3}Ga_{1-X3-Y3}N$ buffer layer 19. The nitride semiconductor device 11a includes a contact layer 33 and a nitride support base 20 having electric conductivity. The first conductivity type nitride semiconductor layer 13, buffer layer 19, active region 17a, second conductivity type nitride semiconductor layer 15, and contact layer 33 are mounted on one surface 20a of the nitride semiconductor support base 20. On the other surface 20b of the nitride semiconductor support base 20, one electrode 35 is provided and another electrode 37 is provided on the contact layer 33. The nitride support base 20 can be, for example, an n-type GaN support base. The GaN support base has excellent heat conduction and heat dissipation. If a GaN support base made of a low-dislocation GaN (e.g., threading dislocation density <$10^6$ cm$^{-2}$) is used as the support base 20, the threading dislocation density of the active region can be also made small.

Since the buffer layer 19 is effective in reducing strain in the nitride semiconductor light emitting device 11a and the active region 17a with excellent crystalline quality, the nitride semiconductor light emitting device 11a is improved in the emission efficiency.

An example of the nitride semiconductor light emitting device 11a is as follows:
support base 20:
  n-type GaN semiconductor;
nitride layer 29:
  n-type GaN semiconductor, 2 μm;
first conductivity type nitride semiconductor layer 13:
  Si-doped n-type $Al_{0.18}Ga_{0.82}N$ semiconductor, 100 nm, 1080° C.;
buffer layer 19:
  InAlGaN semiconductor (indium composition: 5%), 35 nm;
active region 17a:
  InAlGaN quantum well structure (indium composition: 2%)
  well layers: 2.7 nm, barrier layers: 15 nm;
second conductivity type nitride semiconductor layer 15:
  Mg-doped p-type $Al_{0.27}Ga_{0.73}N$ semiconductor, 25 nm;
contact layer 33:
  Mg-doped p-type $Al_{0.18}Ga_{0.82}N$ semiconductor, 100 nm.

The bandgap energies of these barrier layers and this buffer layer is 3.76 eV. This nitride semiconductor light emitting device will be referred to as "D." Even when the electric current of 400 mA is continuously applied to the nitride semiconductor light emitting device D, the nitride semiconductor light emitting device D demonstrates little deterioration of its optical output power and operates stably. A nitride semiconductor light emitting device including well layers and barrier layers of the indium proportion, 5%, will be referred to as "E." At the emission wavelength of 350 nm, the optical output power of the nitride semiconductor light emitting device D is 2.5 times that of the nitride semiconductor light emitting device E.

In the nitride semiconductor device 11a (as well as the nitride semiconductor device 11), the energy gap of the $In_{X2}Al_{Y2}Ga_{1-X2-Y2}N$ barrier layers 27a may be set to be approximately equal to the energy gap of the $In_{X3}Al_{Y3}Ga_{1-X3-Y3}N$ buffer layer 19. Since the buffer layer 19 and barrier layers 27a are made of the quaternary compound semiconductors, the bandgap energies of the quaternary AlInGaN semiconductors can be adjusted by changing the composition of aluminum independently of the composition of indium. Accordingly, the energy gap of the barrier layers 27a can be made approximately equal to the energy gap of the buffer layer 19. The confinement of carriers in the nitride semiconductor light emitting device 11a including the barrier layers 27a and the buffer layer 19 of a composition different from that of the barrier layers 27a is substantially the same confinement as nitride semiconductor light emitting devices including barrier layers and a buffer layer of the same composition as the above barrier layers.

In the nitride semiconductor light emitting device 11a, as shown in areas (B) and (C) of FIG. 3, the energy gap difference between the barrier layers 27a and the buffer layer 19 is preferably not more than 0.12 eV ($1.92 \times 10^{-20}$ J). When the energy gap difference is approximately 0.12 eV, the buffer layer can achieve the better performance of both buffering and confining carriers.

In the nitride semiconductor light emitting device 11a, if the indium proportion X1 of the $In_{X1}Al_{Y1}Ga_{1-X1-Y1}N$ well layers 25a is greater than zero and smaller than 0.03 (0<X1<0.03), the aluminum proportion thereof can be reduced and the active region 17a can generate light of a desired emission wavelength. The surface morphology of the active region 17a becomes excellent. Preferably, the indium proportion X3 of the $In_{X3}Al_{Y3}Ga_{1-X3-Y3}N$ buffer layer 19 is greater than the indium proportion of the $In_{X1}Al_{Y1}Ga_{1-X1-Y1}N$ well layers 25a, and the indium proportion X3 of the $In_{X3}Al_{Y3}Ga_{1-X3-Y3}N$ buffer layer 19 is smaller than 0.10. If the indium proportion X3 of the buffer layer 19 satisfies the relationship of X1<X3<0.10, the crystalline quality of the active region 17a and the strain reducing performance of the buffer layer 19 can be improved.

In the nitride semiconductor light emitting device 11a, preferably, the aluminum proportion Y1 of the $In_{X1}Al_{Y1}Ga_{1-X1-Y1}N$ well layers 25a is greater than 0.05 and this aluminum proportion is less than 0.15. Since the adatom migration of aluminum is low at low temperature, the crystalline quality of the active region 17a can be improved by using a small proportion of aluminum in the growth of the active region 17a. The above range of aluminum proportion is approximately consistent with the indium proportion X1 of the well layers 25a (0<X1<0.03). A nitride semiconductor light emitting device formed by using the above aluminum proportion has an emission spectrum whose peak wavelength is located in a wavelength region of no less than 340 nm nor more than 360 nm.

In the nitride semiconductor light emitting device 11a, since the thickness of the buffer layer 19 is preferably not less than 10 nm, the $In_{X3}Al_{Y3}Ga_{1-X3-Y3}N$ semiconductor layer demonstrates the performance of buffering. Since the thickness of the buffer layer 19 is preferably not more than 100 nm, whereby the $In_{X3}Al_{Y3}Ga_{1-X3-Y3}N$ semiconductor layer has excellent crystalline quality.

In a preferred example, the second conductivity type nitride semiconductor layer 15 has the p-conductivity type, and the contact layer 33 also has the p-conductivity type. The active region 17a generates light containing a first wavelength component in the ultraviolet light region. The first wavelength component is shorter than the wavelength that corresponds to the bandgap of gallium nitride. Since each of the p-type nitride semiconductor layer 15 and p-type contact layer 33 preferably has a bandgap energy larger than the energy that corresponds to the first wavelength component, the amount of light absorbed by the p-type nitride semiconductor layer 15 and the p-type contact layer 33 becomes small.

Figure 4:
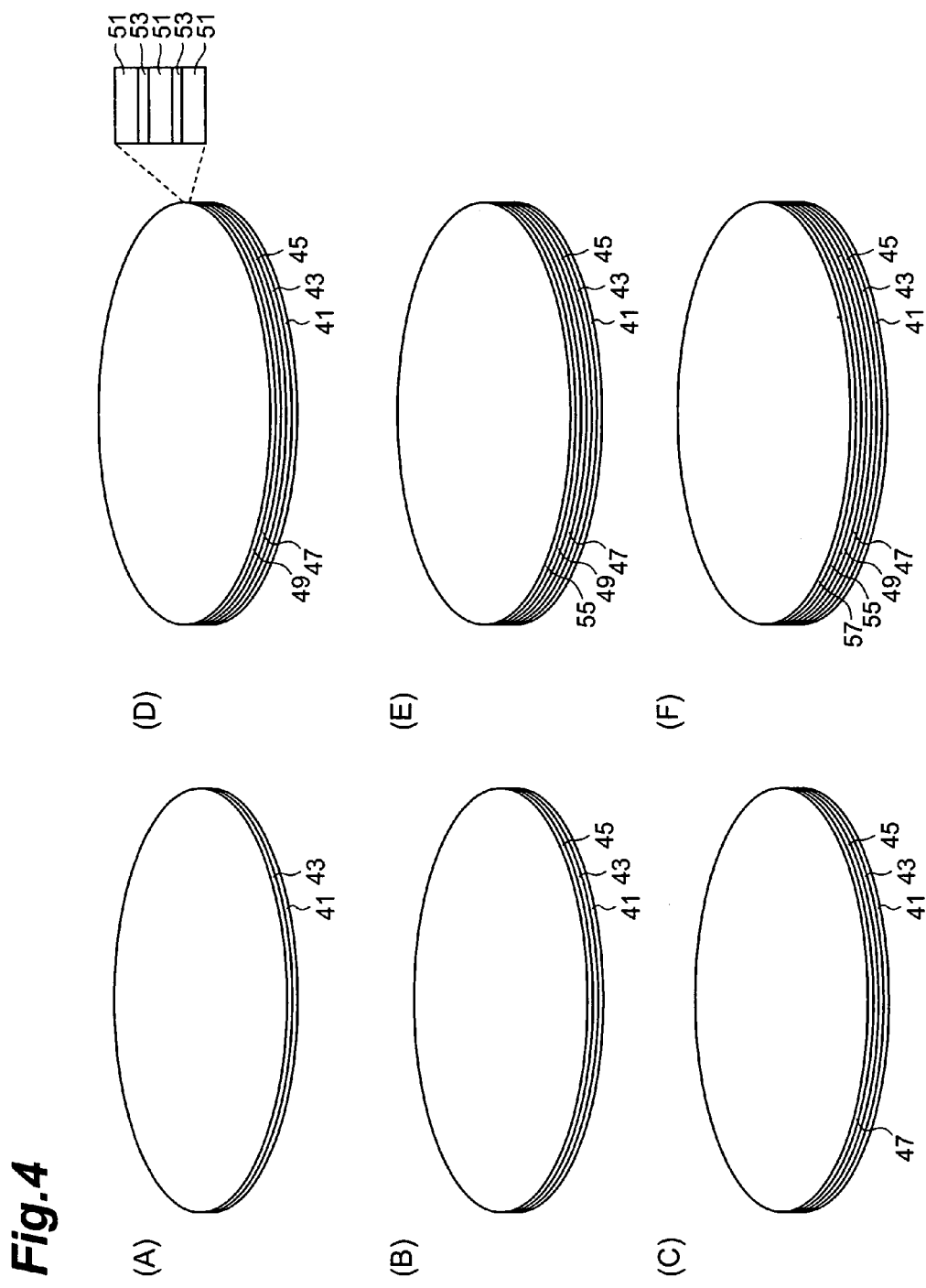
FIG. 4 is a view showing steps of fabricating a nitride semiconductor light emitting device.

Subsequently, a method of fabricating a nitride semiconductor light emitting device will be described. Areas (A), (B), (C), (D), (E), and (F) of FIG. 4 are views showing steps of fabricating a nitride semiconductor light emitting device. Areas (A) and (B) of FIG. 5 are views showing steps of fabricating the nitride semiconductor light emitting device. In the present example, a light emitting diode is fabricated as the nitride semiconductor light emitting device.

As shown in area (A) of FIG. 4, a buffer film 43 is grown on a GaN substrate 41. The buffer film 43 is, for example, a Si-doped n-type gallium nitride film and the thickness thereof is, for example, 2 μm. In the present example, the gallium nitride semiconductor film is deposited, for example, by an organometallic vapor phase epitaxy method. Prior to the formation of the first buffer film 43, it is preferable to perform thermal cleaning of the surface of the GaN substrate 41 by keeping the GaN substrate 41 in an atmosphere of ammonia and hydrogen at 1050° C. for ten minutes.

As shown in area (B) of FIG. 4, a first conductivity type nitride semiconductor film 45 is formed on the substrate 41. The first conductivity type nitride semiconductor film 45 is, for example, an AlGaN film. In an example, this AlGaN film is a Si-doped n-type $Al_{0.18}Ga_{0.82}N$ film and the thickness thereof is, for example, 100 nm.

As shown in area (C) of FIG. 4, an $In_{X3}Al_{Y3}Ga_{1-X3-Y3}N$ (1>X3>0 and 1>Y3>0) buffer film 47 is grown on the first conductivity type nitride semiconductor film 45. The buffer film 47 is formed at the first temperature T1. In order to obtain the indium proportion necessary for the effect of buffering, the temperature T1 is preferably not less than 750° C. nor more than 880° C. In an example, the first temperature T1 is, for example, 780° C. and the thickness of the buffer film 47 is, for example, 35 nm.

As shown in area (D) of FIG. 4, an InAlGaN active region 49 is grown on the buffer film 47. The formation of the active region 49 requires the following steps: forming a barrier film 51; forming a well film 53. In the step of forming the barrier film 51, an $In_{X2}Al_{Y2}Ga_{1-X2-Y2}N$ (1>X2>0 and 1>Y2>0) semiconductor film is formed at the second temperature T2. In order to encourage the adatom migration so as to enhance crystalline quality of the barrier film 51, the temperature T2 is preferably not less than 800° C. In order to form the barrier film 51 of an indium proportion necessary for improvement in the emission characteristics, the temperature T2 is preferably not more than 930° C. In the step of forming the well film 53, an $In_{X1}Al_{Y1}Ga_{1-X1-Y1}N$ (X1>0 and Y1>0) semiconductor film is formed at the third temperature T3. In order to accelerate the adatom migration to enhance crystalline quality of the well film 53, the temperature T3 is preferably not less than 800° C. and, in order to form the well film 53 of an indium proportion necessary for improvement in the light emission characteristics, the temperature T3 is preferably not more than 930° C. The second temperature T2 and third temperature T3 are higher than the first temperature T1. Since the barrier films 51 and well films 53 are grown at the temperatures T2 and T3, respectively, which are higher than the film formation temperature T1 of the buffer film 47 in this method, they demonstrate excellent crystalline quality and have small indium proportions. On the other hand, since the buffer film 47 is grown at the temperature T1 lower than the film formation temperature T2 of the barrier films 51 and the film formation temperature T3 of the well films 53, the indium composition of the buffer film 47 is great and thus has an excellent performance for reducing the strain.

The active region 49 of the present example has the quantum well structure of 2MQW, the thickness of well films 53 is, for example, 2.7 nm, and the thickness of barrier films 51, for example, 15 nm. In an example, the barrier films 51 and well films 53 are deposited at 830° C., and this temperature is higher than 780° C. which is the film formation temperature of the buffer film 37. The indium composition of the well films 53 and barrier films 51 are 2%, and the indium composition of the buffer film 47 is 5%.

As shown in area (E) of FIG. 4, a second conductivity type nitride semiconductor film 55 is formed on the active region 49. The second conductivity type nitride semiconductor film 55 is, for example, an AlGaN film. In an example, this AlGaN film is an Mg-doped p-type $Al_{0.27}Ga_{0.73}N$ film, and the thickness thereof is, for example, 25 nm. The second conductivity type nitride semiconductor film 55 is provided for blocking electrons.

As shown in area (F) of FIG. 4, a contact film 57 is formed on the second conductivity type nitride semiconductor film 55. The bandgap of the contact film 57 is smaller than the bandgap of the second conductivity type nitride semiconductor film 55. The carrier density of the contact film 57 is preferably larger than the carrier density of the second conductivity type nitride semiconductor film 55. The contact film 57 is, for example, an Mg-doped p-type $Al_{0.18}Ga_{0.82}N$ film and the thickness thereof is, for example, 100 nm.

As shown in area (A) of FIG. 5, a first electrode 59 is formed on the back side of the GaN substrate 41. In an example, the first electrode 59 serves as a cathode electrode. As shown in area (B) of FIG. 5, second electrodes 61 are formed on the contact film 57. The second electrodes 61 are arranged in array, and in an example, each second electrode 61 serves as an anode electrode. After the formation of the first and second electrodes 59, 61, a semiconductor substrate product 63 is cut along dashed lines CUT1 and CUT2 to obtain a plurality of nitride semiconductor light emitting devices 11a.

As described above, the present embodiment provides the method of fabricating nitride semiconductor light emitting devices, and the emission efficiency of the nitride semiconductor light emitting devices is improved.

Third Embodiment

Figure 6:
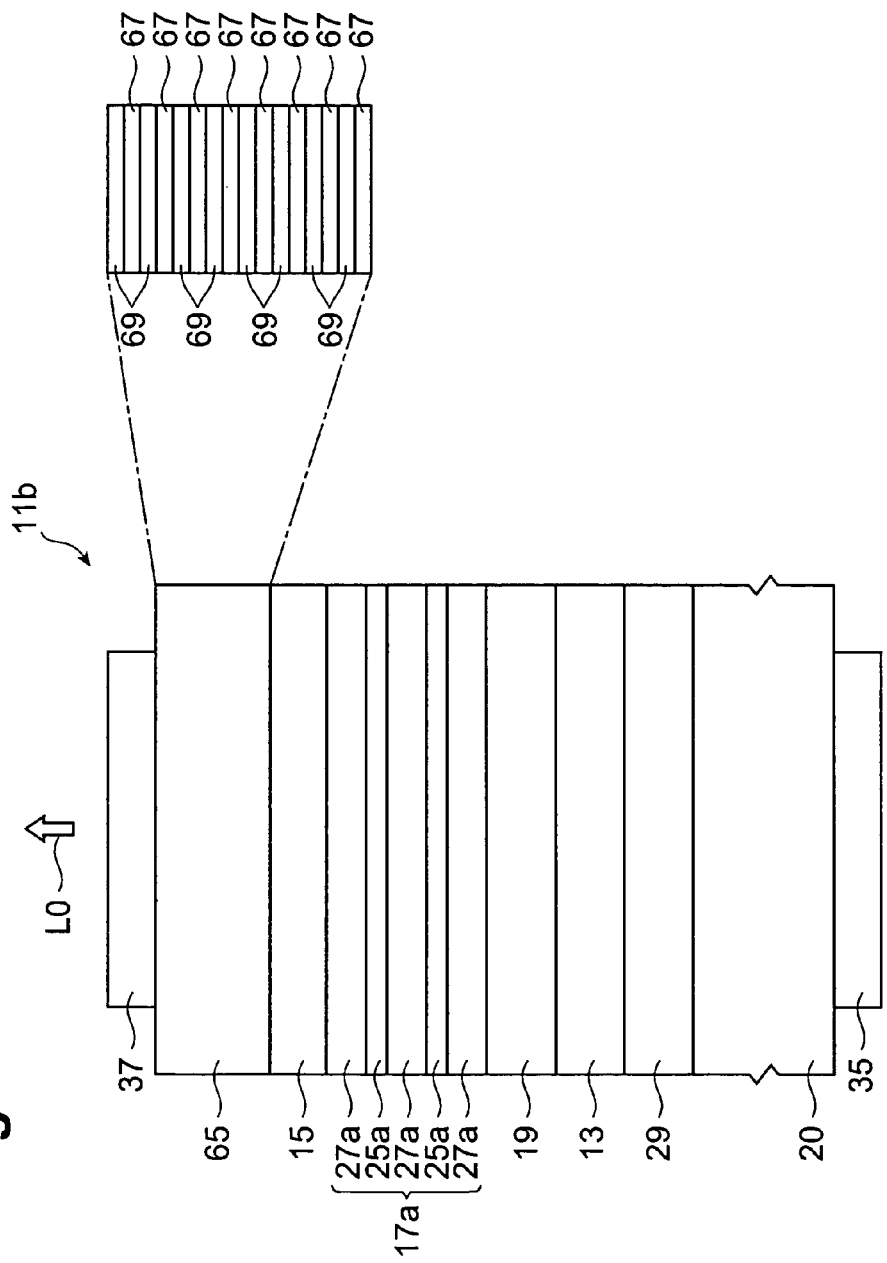
FIG. 6 is a view showing a nitride semiconductor light emitting device according to the third embodiment.

FIG. 6 is a drawing showing a nitride semiconductor device according to the third embodiment. The nitride semiconductor device 11b includes a contact region 65 instead of the contact layer 33. The second conductivity type nitride semiconductor layer 15 is provided between the active region 17a and the contact region 65. The contact region 65 includes a plurality of first AlGaN layers 67 and a plurality of second AlGaN layers 69. The composition of the first AlGaN layers 67 is different from that of the second AlGaN layers 69. The first AlGaN layers 67 and the second AlGaN layers 69 are alternately arranged so as to form a superlattice structure. In a preferred example, the first AlGaN layers 67 and/or the second AlGaN layers 69 exhibit p-conductivity type. Since this contact region 65 has the superlattice structure, the hole density in the contact region 65 becomes large. The buffer layer 19 has excellent performance for reducing strain in the nitride semiconductor light emitting device 11b and the active region 17a has excellent crystalline quality. Accordingly, the light generation efficiency of the nitride semiconductor light emitting device 11b is improved.

In an example, the first AlGaN layers 67 are made, for example, of a p-type $Al_{0.24}Ga_{0.76}N$ semiconductor and are formed, for example, at 1030° C. The second AlGaN semiconductor layers 69 are made, for example, of a p-type $Al_{0.17}Ga_{0.83}N$ semiconductor and are formed, for example, at 1030° C. The contact region 65 is obtained by alternately laminating eight cycles of the first AlGaN layers 67 and second AlGaN layers 69 and the thicknesses of the first AlGaN layers 67 and the second AlGaN layers 69 are, for example, 3.8 nm.

This nitride semiconductor light emitting device will be referred to as "F." Current is applied to the nitride semiconductor light emitting device F and the power of light L0 emitted from the active region 17a through the contact region 65 is measured. The optical output power of the nitride semiconductor light emitting device F is 1.4 times the optical output power of the nitride semiconductor light emitting device D at the emission wavelength of 350 nm.

Fourth Embodiment

Figure 7:
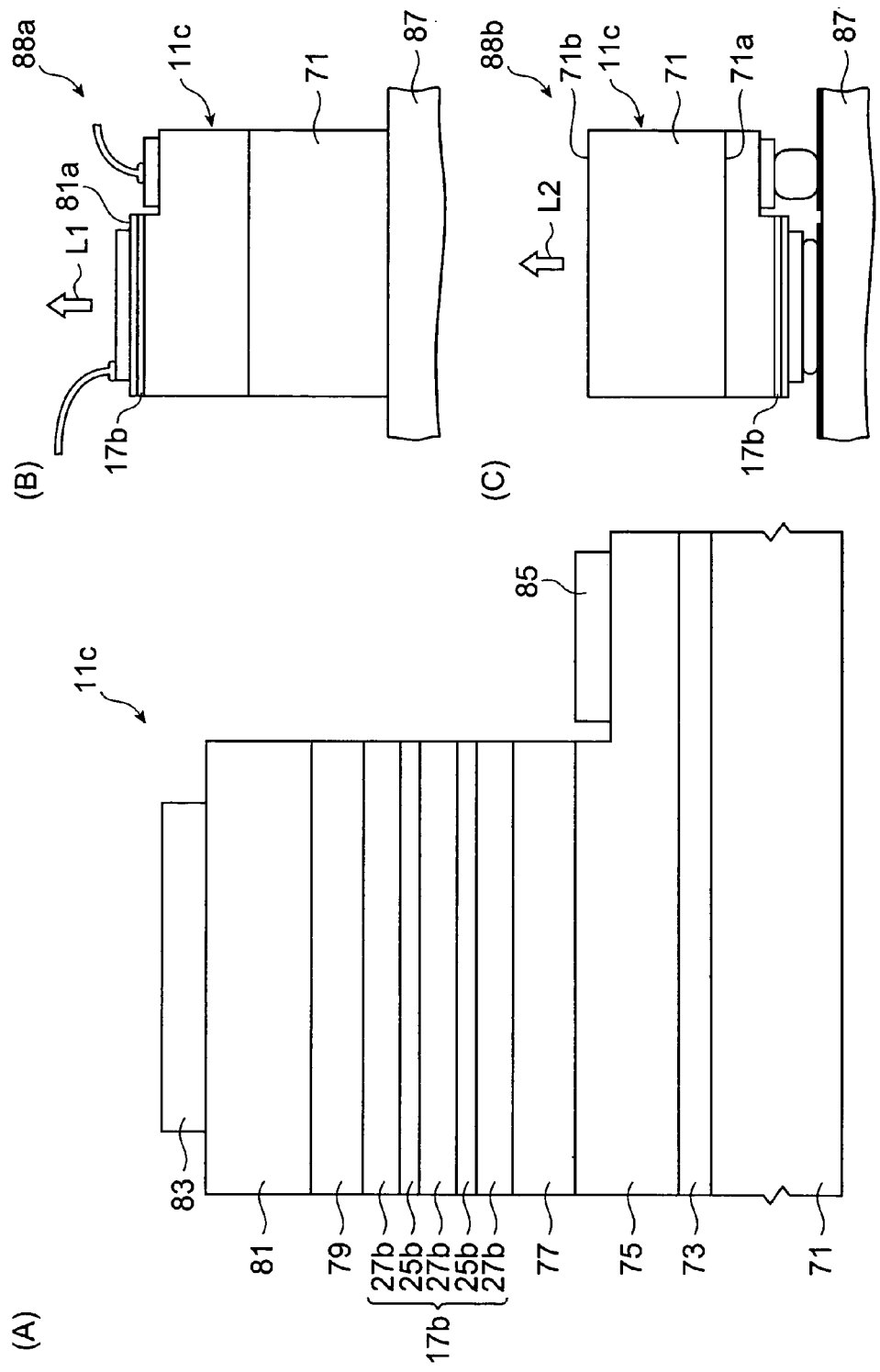
FIG. 7 is a view showing a nitride semiconductor light emitting device according to the fourth embodiment, and light emitting devices incorporating the nitride semiconductor light emitting device and a support.

Area (A) of FIG. 7 is a view showing a nitride semiconductor light emitting device according to the fourth embodiment. The nitride semiconductor light emitting device 11c has an insulating support base such as a sapphire support base 71, and has a buffer layer 73, a first conductivity type nitride semiconductor layer 75, a buffer layer 77, an active region 17b, a second conductivity type nitride semiconductor layer 79, and a contact layer 81. A nitride semiconductor region is formed on the buffer layer 73, and this nitride semiconductor region includes the first conductivity type nitride semiconductor layer 75, buffer layer 77, active region 17b, second conductivity type nitride semiconductor layer 79 and contact layer 81. The sapphire support base 71 is an example of the insulating support base.

In a preferred example, prior to the formation of the nitride layers, a substrate like the sapphire support base 71 is exposed in a hydrogen atmosphere at 1200° C. for ten minutes to clean the surface thereof. The buffer layer 73 is, for example, an aluminum nitride layer and the thickness thereof is, for example, 30 nm. The aluminum nitride layer is formed, for example, at 500° C. The first conductivity type nitride semiconductor layer 75 is, for example, an AlGaN layer. In an example, this AlGaN layer is made, for example, of a Si-doped n-type $Al_{0.18}Ga_{0.82}N$ semiconductor and the thickness thereof is, for example, 2.5 μm. The n-type $Al_{0.18}Ga_{0.82}N$ semiconductor layer is formed, for example, at 1080° C. The buffer layer 77 is made of an InAlGaN semiconductor and the indium proportion thereof is 5%. The buffer layer 77 can be formed using the conditions described hereinbefore. The active region 17b has the quantum well structure, for example, including InAlGaN well layers 25b and InAlGaN barrier layers 27b, the indium proportions of the well layers 25b and barrier layers 27b are 2%, and the well layers 25b and barrier layers 27b can be formed using the conditions described hereinbefore. The second conductivity type nitride semiconductor layer 79 is, for example, an AlGaN layer. In an example, this AlGaN layer is made of an Mg-doped p-type $Al_{0.27}Ga_{0.73}N$ semiconductor, the thickness thereof is, for example, 25 nm, and the Mg-doped p-type $Al_{0.27}Ga_{0.73}N$ semiconductor layer is formed, for example, at 1030° C. The contact layer 81 is, for example, an AlGaN layer. In an example, this AlGaN layer is made of a p-type $Al_{0.18}Ga_{0.82}N$ semiconductor, the thickness thereof is, for example, 100 nm, and the Mg-doped p-type $Al_{0.18}Ga_{0.82}N$ semiconductor layer is formed, for example, at 1030° C.

After the formation of the above nitride layers, the relevant nitride layers (buffer layer 77, active region 17b, second conductivity type nitride semiconductor layer 79, and contact layer 81) are partially etched (e.g., by reactive ion etching) to expose a part of the first conductivity type nitride semiconductor layer 75. A first electrode 83 (e.g., anode electrode) is formed on the contact layer 81, and a second electrode 85 (e.g., cathode electrode) is formed on the exposed region of the first conductivity type nitride semiconductor layer 75. The nitride semiconductor light emitting device obtained through the above steps will be referred to as "G." A nitride semiconductor light emitting device H is also fabricated and includes an active region having the indium proportion of 5%.

Areas (B) and (C) of FIG. 7 show views for respective light emitting devices 88a, 88b each including the nitride semiconductor light emitting device 11c and a support 87. Referring to area (B) of FIG. 7, the nitride semiconductor light emitting device 11c is mounted on the support 87. The support 87 mounts the sapphire support base 71 thereon. The size of the sapphire support base 71 is, for example, 400 μm×400 μm and is substantially the same as the size of the nitride structure.

In the nitride semiconductor light emitting device 11c, the contact layer 81 has an emitting surface 81a through which light L1 from the active region 17b is emitted. The bandgap energies of the second conductivity type nitride semiconductor layer 79 and contact layer 81 are larger than the energy that corresponds to the first wavelength component of the light L1 generated by the active region 17b. The bandgap energy of the first conductivity type nitride semiconductor layer 75 is larger than the energy corresponding to the first wavelength component. This reduces the absorption of light from the active region by the first conductivity type nitride semiconductor layer and the second conductivity type nitride semiconductor layer. In the light emitting device 88a shown in area (B) of FIG. 7, the optical output power of the nitride semiconductor light emitting device G is 2.5 times that of the nitride semiconductor light emitting device H.

Referring to area (C) of FIG. 7, the nitride semiconductor light emitting device 11c is mounted on the support 87. The nitride semiconductor light emitting device G is mounted on the support 87 by a flip chip method.

In the nitride semiconductor light emitting device 11c, the sapphire support base 71 has a first surface 71a and a second surface 71b. The first conductivity type nitride semiconductor layer 75, buffer layer 77, active region 17b, and second conductivity type nitride semiconductor layer 79 are mounted on the first surface 71a. Light L2 from the active region is emitted through the second surface 71b. In this nitride semiconductor light emitting device 11c, the nitride regions 73, 75, and 77 are located between the active region 17b and the second surface 71b of the sapphire support base 71 and are capable of transmitting the light L2. Thus, the light L2 is emitted from the second surface 71b of the sapphire support base 71. The optical output power of the nitride semiconductor light emitting device G shown in area (C) of FIG. 7 is 2.5 times the optical output power of the nitride semiconductor light emitting device G shown in area (B) of FIG. 7.

As described above, the emission efficiency of the nitride semiconductor light emitting device according to the present embodiment is improved.

Fifth Embodiment

Figure 8:
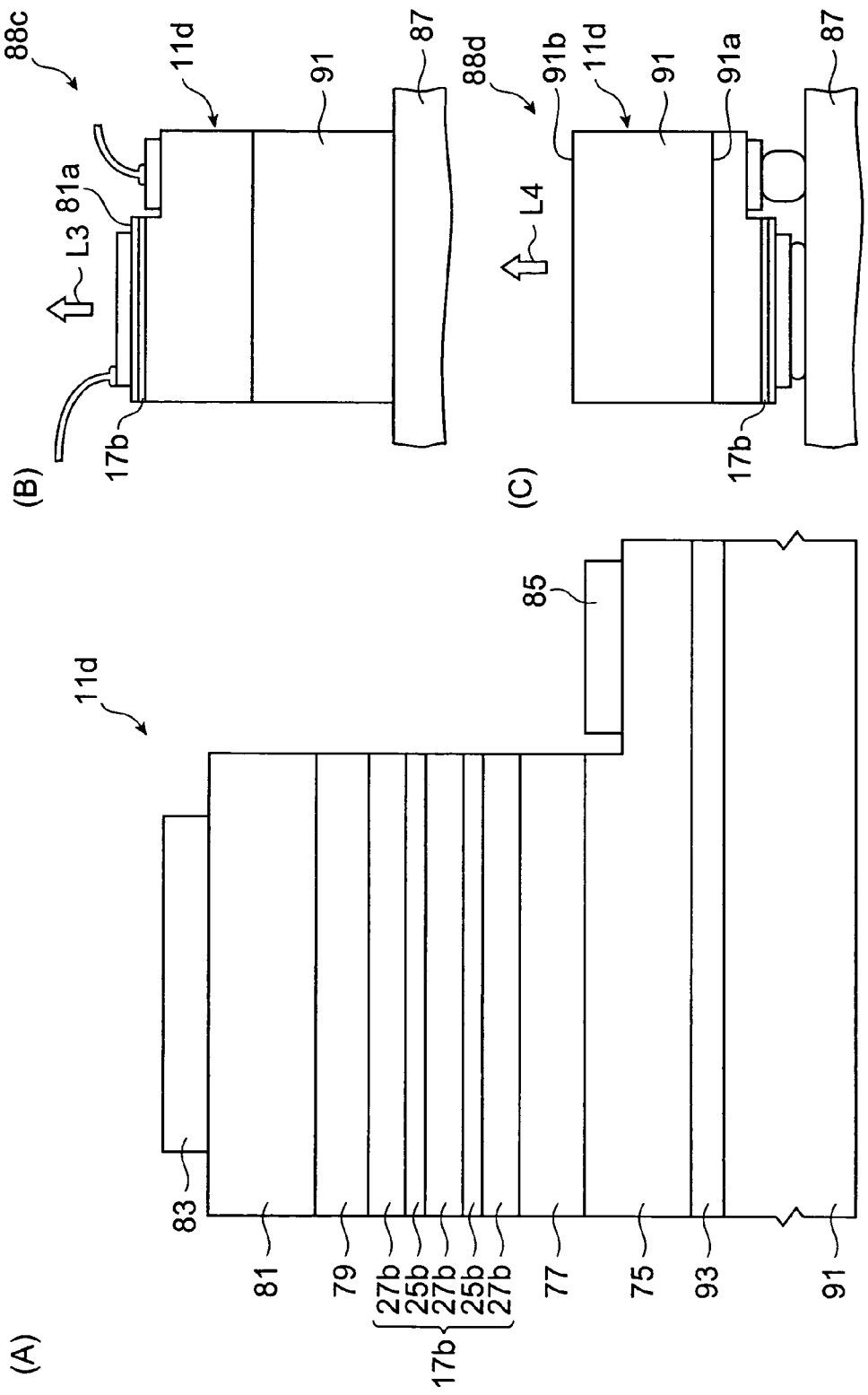
FIG. 8 is a view showing a nitride semiconductor light emitting device according to the fifth embodiment and showing light emitting devices incorporating the nitride semiconductor light emitting device and a support.

Area (A) of FIG. 8 shows a nitride semiconductor light emitting device according to the fifth embodiment. The nitride semiconductor light emitting device 11*d* has an insulating support base such as an aluminum nitride support base 91, a buffer layer 93, the first conductivity type nitride semiconductor layer 75, the buffer layer 77, the active region 17*b*, the second conductivity type nitride semiconductor layer 79, and a contact layer 81. The nitride semiconductor region including the first conductivity type nitride semiconductor layer 75, buffer layer 77, active region 17*b*, second conductivity type nitride semiconductor layer 79, and contact layer 81 is formed on the buffer layer 93. Since the heat conduction of the aluminum nitride support base 91 is excellent, the nitride semiconductor light emitting device 11*d* has excellent heat dissipating characteristics. The aluminum nitride support base 91 is an example of the insulating support base, and a $Ga_ZAl_{1-Z}N$ (where Z is not less than 0 and is less than 1) support base can be used instead of the insulating support base.

In a preferred example, prior to the formation of the nitride layers, an aluminum nitride substrate used as the support base 91 is exposed in an atmosphere of ammonia and hydrogen at 1050° C. for ten minutes to clean the surface thereof The buffer layer 73 is, for example, an aluminum nitride layer, the thickness thereof is, for example, 100 nm, and the aluminum nitride layer is formed, for example, at 1150° C. The first conductivity type nitride semiconductor layer 75 is made, for example, of a Si-doped n-type $Al_{0.18}Ga_{0.82}N$ semiconductor, the thickness thereof is, for example, 2.5 µm, and the n-type $Al_{0.18}Ga_{0.82}N$ semiconductor layer is formed, for example, at 1150° C. The formation of the nitride layers subsequent thereto can be performed in the same manner as in the preferred example in the fourth embodiment, but the formation of the nitride layers is not limited thereto.

After the nitride layers have been formed, the nitride layers (the buffer layer 77, the active region 17*b*, the second conductivity type nitride semiconductor layer 79, and the contact layer 81) on the surface of the aluminum nitride substrate are partially etched (e.g., by reactive ion etching) to expose a part of the first conductivity type nitride semiconductor layer 75. A first electrode 83 (e.g., anode electrode) is formed on the contact layer 81, and a second electrode 85 (e.g., cathode electrode) is formed on the exposed region of the first conductivity type nitride semiconductor layer 75. After the above steps, the nitride semiconductor light emitting device is obtained and will be referred to as "I." Another nitride semiconductor device having an active region of the indium proportion of 5% is prepared and will be referred to as "J."

Areas (B) and (C) of FIG. 8 show respective light emitting devices 88*c*, 88*d* each including the nitride semiconductor light emitting device 11*d* and a support 87. As shown in area (B) of FIG. 8, the nitride semiconductor light emitting device 11*d* can be mounted on the support 87. Light L3 from active region 17*b* is emitted from the emitting surface 81*a* of the contact layer 81. The optical output power of the nitride semiconductor light emitting device I shown in area (B) of FIG. 8 is 2.5 times that of the nitride semiconductor light emitting device J.

As shown in area (C) of FIG. 8, the nitride semiconductor light emitting device 11*d* can be mounted on the support 87. Light L4 from the active region 17*b* passes through the nitride region provided between the active region 17*b* and an aluminum nitride support base 91 and is emitted from the second surface 91*b* of the aluminum nitride support base 91. The optical output power of the nitride semiconductor light emitting device I shown in area (C) of FIG. 8 is 2.5 times the optical output power of the nitride semiconductor light emitting device I shown in area (B) of FIG. 8.

Furthermore, the nitride semiconductor light emitting device 11*d* has excellent heat dissipating characteristics because the thermal conductivity of $Ga_ZAl_{1-Z}N$ is larger than that of sapphire. In either of the mounting forms shown in areas (B) and (C) of FIG. 8, the nitride semiconductor light emitting device I demonstrates little degradation of optical output power and stably operates even when current of 400 mA is continuously applied thereto.

Sixth Embodiment

Figure 9:
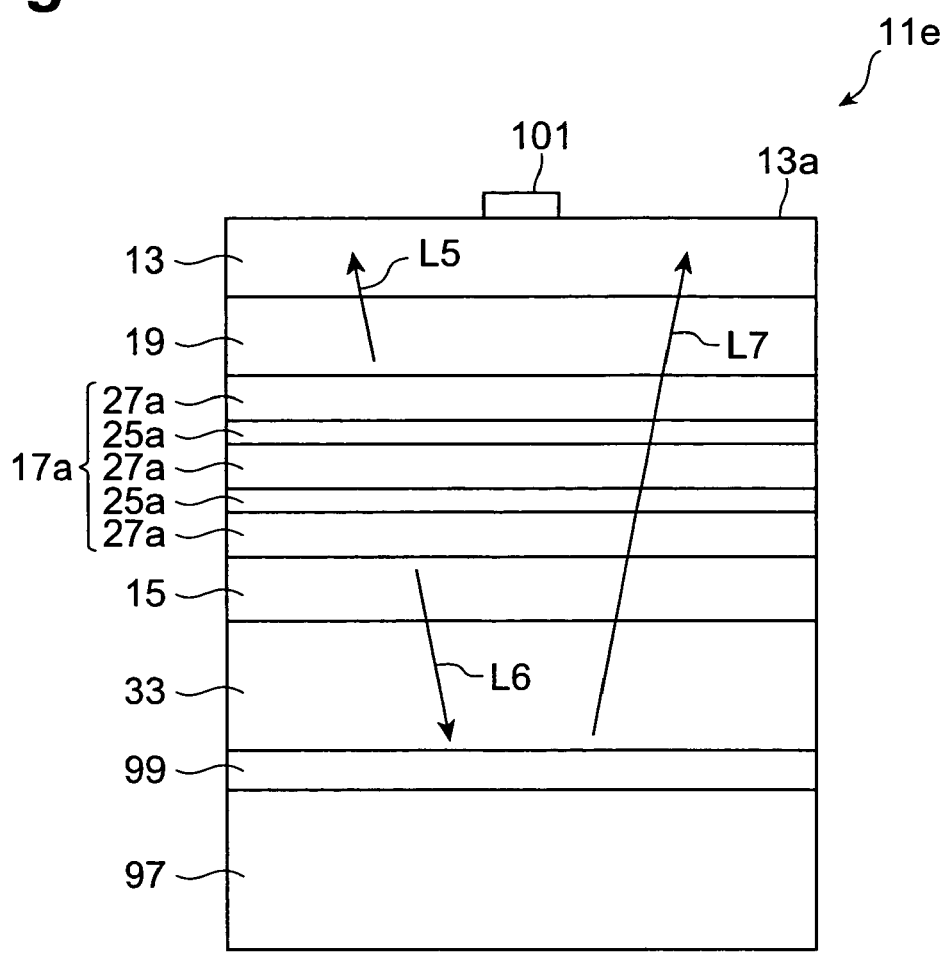
FIG. 9 is a view showing a nitride semiconductor light emitting device according to the sixth embodiment.

FIG. 9 is a drawing showing a nitride semiconductor light emitting device according to the sixth embodiment. The nitride semiconductor light emitting device 11*e* includes a metal support base 97. The contact layer 33, second conductivity type nitride semiconductor layer 15, active region 17*a*, buffer layer 19, and first conductivity type nitride semiconductor layer 13 are provided sequentially on a metal support base 97. An electrode 99 is provided between the contact layer 33 and the metal support base 97. The active region 17*a* generates light L5, L6 containing the wavelength component in the ultraviolet region. The light L6 is reflected by the electrode 99 to form the reflected light L7. The light L5 and L7 is emitted from the emitting surface 13*a* of the first conductivity type nitride semiconductor layer 13. An electrode 101 is provided on the emitting surface 13*a* of the first conductivity type nitride semiconductor layer 13. In the nitride semiconductor light emitting device 11*e*, the structure containing the contact layer 33, second conductivity type nitride semiconductor layer 15, active region 17*a*, buffer layer 19, first conductivity type nitride semiconductor layer 13, and electrode 99 is mounted on the metal support base 97, and the metal support base 97 in the nitride semiconductor light emitting device 11*e* is made of material different from that of a substrate (e.g., GaN substrate) on which the second conductivity type nitride semiconductor layer 15, active region 17*a*, buffer layer 19, and first conductivity type nitride semiconductor layer 13 have been grown.

In this semiconductor light emitting device 11*e*, the semiconductor films associated with the generation of light can be formed on the GaN substrate with a low dislocation density and the metal support base 97 used as the support base has excellent heat dissipation and is not made of GaN semiconductor which absorbs ultraviolet light. The material of the metal support base 97 can be, for example, CuW alloy or FeNi alloy. The electrode 99 having high reflectance can be made of a combination of an Ni/Au semitransparent electrode with an Ag alloy layer, or a platinum (Pt) electrode film.

Subsequently, a method of fabricating nitride semiconductor light emitting devices will be described. Areas (A), (B), (C), (D), (E), and (F) of FIG. 10 show steps of fabricating nitride semiconductor light emitting devices. Areas (A) and (B) of FIG. 11 are cross sectional views of a nitride semiconductor light emitting device in production steps. In the present example, light emitting diodes are fabricated as nitride semiconductor light emitting devices.

An epitaxial wafer E for nitride semiconductor light emitting devices 11*e* is formed using steps similar to a sequence of steps shown in areas (A), (B), (C), (D), (E) and (F) of FIG. 4, and areas (A) and (B) of FIG. 5. After the steps, the epitaxial wafer E as shown in area (A) of FIG. 10 is obtained. As shown area (A) of FIG. 11, the epitaxial wafer E has a sacrifice film 103 provided between the buffer film 43 and the first conductivity type nitride semiconductor film 45. The sacrifice film 103 is a nitride semiconductor layer having the bandgap smaller than the bandgaps of the substrate 41 and buffer film 43, and can be made, for example, of an InGaN semiconductor. The epitaxial wafer E includes an electrically conductive film 105 provided on the contact film 57. The conductive film 105 is used for reflection of light from the active region and for supply of carries. The material of the conductive film 105 can be a combination of an Ni/Au semitransparent electrode film with an Ag alloy film, or a platinum (Pt) electrode film.

As shown in area (B) of FIG. 10, a metal substrate 107 is prepared. The size of the metal substrate 107 is preferably not smaller than the size of the substrate 41. The shape of the metal substrate 107 is not limited to the shape of a circular disk as shown in area (B) of FIG. 10. One surface 107a of the metal substrate 107 is bonded to the conductive film 105. If required, electroconductive adhesive can be used for this bonding. The electroconductive adhesive can be, for example, AuSn, PbSn, or the like.

As shown in area (C) of FIG. 10 and area (B) of FIG. 11, the substrate product F is formed by bonding the epitaxial wafer E to one surface 107a of the substrate 107.

As shown in area (D) of FIG. 10, after the metal substrate 107 is bonded onto the second conductivity type nitride semiconductor film 57, the GaN substrate 41 is separated from the first conductivity type nitride semiconductor film 45. This separation is carried out, for example, by lifting off the GaN substrate 41 from the first conductivity type nitride semiconductor film 45 by use of the sacrifice film 103. In a preferred method, a laser beam 109 is radiated to the GaN substrate 41. The laser beam 109 passes through the GaN substrate 41 and buffer film 43 and then is absorbed by the sacrifice film 103. The absorption of the laser beam 109 melts the sacrifice film 103, and results in lifting off the GaN substrate 41 from the first conductivity type nitride semiconductor film 45. This lifting off separates the substrate product F into first portion F1 and second portion F2. A part of the molten sacrifice film remains on the molten surface S1 of the first portion F1. The molten surface S1 is polished to expose the first conductivity type nitride film 45. A part of the molten sacrifice film also remains on the molten surface S2 of the second portion F2. The molten surface S2 is polished to expose the buffer film 43 and the substrate is reconditioned and reused for fabrication of another epitaxial wafer as occasion may demand.

As shown in area (E) of FIG. 10, an electro-conductive film 111 is formed on the exposed surface 45a of the first conductivity type nitride film 45. Then, a plurality of electrodes 111a are formed from the electro-conductive film 111 by photolithography. As shown in area (F) of FIG. 10, the electrodes 111a are arrayed on the exposed surface of the first conductivity type nitride film 45. After this step, the first portion F1 is cut along dashed lines CUT3 and CUT4 to form nitride semiconductor light emitting devices, one of which is labeled as "11e."

This method can produce the nitride semiconductor light emitting devices including the metal support base with excellent heat dissipating characteristics without using GaN support bases, which absorb ultraviolet light. Since the barrier films and well films can be grown at the temperatures higher than that of the buffer film, each of the barrier films and well films demonstrates good crystalline quality and has a lower indium proportion. On the other hand, since the buffer film is grown at a temperature lower than temperatures at which the barrier films and well films are formed, the buffer film has a larger indium proportion and thus has an excellent strain reducing performance.

Having described the semiconductor light emitting devices and fabrication methods thereof with reference to the embodiments. For fabricating the InAlGaN light emitting device, the InAlGaN semiconductor barrier layers in the active region are formed using the substantially same film formation conditions as the InAlGaN semiconductor buffer layer. If the barrier layers (In: 5% and Al: 24%) and well layers (In: 6% and Al: 19%) are used for the ultraviolet light emitting device X, the ultraviolet light emitting device X generates light of the emission wavelength of, for example, about 350 nm. It is, however, difficult to grow the InAlGaN semiconductor of an aluminum proportion ranging form 19% to 24% at the temperature of about 780° C.

If the film formation temperature for forming the active region is increased up to about 830° C., the indium proportion and aluminum proportion of the barrier layers and well layers become decreased. For example, if the barrier layers (In: 2% and Al: 22%) and well layers (In: 2% and Al: 9%) are used for a semiconductor light emitting device Y, the emission wavelength thereof is about 350 nm. The peak intensity of photoluminescence of the quantum well structure in this semiconductor light emitting device Y is greater than that of the quantum well structure in the above semiconductor light emitting device X.

Furthermore, a semiconductor light emitting device Z is formed by growing both the active region and InAlGaN buffer layer at 830° C. The peak intensity of photoluminescence of the quantum well structure in the semiconductor light emitting device Z is smaller than that of the quantum well structure in the semiconductor light emitting device Y Namely, the crystalline quality of InAlGaN semiconductors in the active region becomes excellent when their growth temperatures become high (or their indium proportions become low), thereby improving the optical output power. On the other hand, InAlGaN semiconductors are effective in reducing strain in the active region when their growth temperatures become low (or their indium proportions become high,.

Having described and illustrated the principle of the invention in a preferred embodiment thereof, it is appreciated by those having skill in the art that the invention can be modified in arrangement and detail without departing from such principles. The present invention shall not be limited to the specific examples disclosed in the specification. We therefore claim all modifications and variations coming within the spirit and scope of the following claims.

What is claimed is:

1. A nitride semiconductor light emitting device for generating light containing a wavelength component in an ultraviolet region, the device comprises:

a first conductivity type nitride semiconductor layer provided on a support base;

a second conductivity type nitride semiconductor layer provided on the support base;

an active region provided between the first conductivity type nitride semiconductor layer and the second conductivity type nitride semiconductor layer, the active region including an $In_{X1}Al_{Y1}Ga_{1-X1-Y1}N$ well layer ($1>X1>0$ and $1>Y1>0$) and an $In_{X2}Al_{Y2}Ga_{1-X2-Y2}N$ barrier layer ($1>X2>0$ and $1>Y2>0$); and an $In_{X3}Al_{Y3}Ga_{1-X3-Y3}N$ buffer layer ($1>X3>0$ and $1>Y3>0$) provided between the active region and the first conductivity type nitride semiconductor layer, a proportion X1 of indium in the $In_{X1}Al_{Y1}Ga_{1-X1-Y1}N$ well layer being smaller than a proportion X3 of indium in the $In_{X3}Al_{Y3}Ga_{1-X3-Y3}N$ buffer layer, a proportion X2 of indium in the $In_{X2}Al_{Y2}Ga_{1-X2-Y2}N$ barrier layer being smaller than the proportion X3 of indium in the $In_{X3}Al_{Y3}Ga_{1-X3-Y3}N$ buffer layer, and the $In_{X3}Al_{Y3}Ga_{1-X3-Y3}N$ buffer layer being in direct physical contact with the active region.

2. The nitride semiconductor light emitting device according to claim 1, wherein a bandgap energy difference between the $In_{X2}Al_{Y2}Ga_{1-X2-Y2}N$ barrier layer and the $In_{X3}Al_{Y3}Ga_{1-X3-Y3}N$ buffer layer is equal to or lower than $1.92 \times 10^{-20}$ J.

3. The nitride semiconductor light emitting device according to claim 1, wherein the proportion X1 of indium in the $In_{X1}Al_{Y1}Ga_{1-X1-Y1}N$ well layer is larger than zero and smaller than 0.03, and the proportion X3 of indium in the $In_{X3}Al_{Y3}Ga_{1-X3-Y3}N$ buffer layer is smaller than 0.10.

4. The nitride semiconductor light emitting device according to claim 3, wherein a proportion Y1 of aluminum in the $In_{X1}Al_{Y1}Ga_{1-X1-Y1}N$ well layer is larger than 0.05, the proportion Y1 of aluminum in the $In_{X1}Al_{Y1}Ga_{1-X1-Y1}N$ well layer is smaller than 0.15, and the active region has a quantum well structure for generating light of a wavelength not less than 340 nm nor more than 360 nm.

5. The nitride semiconductor light emitting device according to claim 1, wherein a thickness of the $In_{X3}Al_{Y3}Ga_{1-X3-Y3}N$ buffer layer is equal to or more than 10 nm, and the thickness of the $In_{X3}Al_{Y3}Ga_{1-X3-Y3}N$ buffer layer is equal to or less than 100 nm.

6. The nitride semiconductor light emitting device according to claim 1, wherein the second conductivity type nitride semiconductor layer has p-conductivity type, the active region has a structure to generate light of a first wavelength, the first wavelength is smaller than a wavelength corresponding to a bandgap energy of GaN, and a bandgap energy of the second conductivity type nitride semiconductor layer is greater than an energy corresponding to the first wavelength.

7. The nitride semiconductor light emitting device according to claim 6, further comprising:
one or more first AlGaN semiconductor layers; and
one or more second AlGaN semiconductor layers; at least one layers of the first AlGaN semiconductor layers and the second AlGaN semiconductor layers having p-conductivity type, compositions of the second AlGaN semiconductor layers being different from compositions of the first AlGaN semiconductor layers, the first AlGaN semiconductor layers and the second AlGaN semiconductor layers being arranged to form a superlattice structure, the second conductivity type nitride semiconductor layer being provided between the superlattice structure and the active region, and the second conductivity type nitride semiconductor layer having p-conductivity type.

8. The nitride semiconductor light emitting device according to claim 1, further comprising:
another second conductivity type nitride semiconductor layer provided on the second conductivity type nitride semiconductor layer, the other second conductivity type nitride semiconductor layer having a surface, an electrode being provided on the surface of the other second conductivity type nitride semiconductor layer, light from the active region being emitted through the surface of the other second conductivity type nitride semiconductor layer, the support base being a sapphire support base, the sapphire support base having a first surface, the first conductivity type nitride semiconductor layer, the active region, the second conductivity type nitride semiconductor layer and the other second conductivity type nitride semiconductor layer being mounted on the first surface of the sapphire support base, a bandgap energy of the first conductivity type nitride semiconductor layer being larger than an energy corresponding to a peak wavelength component of the light from the active region.

9. The nitride semiconductor light emitting device according to claim 1, wherein the support base is a sapphire support base, a bandgap energy of the first conductivity type nitride semiconductor layer is larger than an energy corresponding to a peak wavelength component of light from the active region, the sapphire support base has a first surface and a second surface, the first conductivity type nitride semiconductor layer, the active region and the second conductivity type nitride semiconductor layer are mounted on the first surface of the sapphire support base, light from the active region is emitted through the second surface of the sapphire support base.

10. The nitride semiconductor light emitting device according to claim 1, further comprising:
another second conductivity type nitride semiconductor layer provided on the second conductivity type nitride semiconductor layer, the other second conductivity type nitride semiconductor layer having a surface, an electrode being provided on the surface of the other second conductivity type nitride semiconductor layer, light from the active region being emitted through the surface of the other second conductivity type nitride semiconductor layer, the support base being a $Ga_ZAl_{1-Z}N$ (where Z is not less than 0 nor more than 1) support base, the $Ga_ZAl_{1-Z}N$ support base having a surface, the first conductivity type nitride semiconductor layer, the active region, the second conductivity type nitride semiconductor layer and the other second conductivity type nitride semiconductor layer being mounted on the surface of the $Ga_ZAl_{1-Z}N$ support base.

11. The nitride semiconductor light emitting device according to claim 10, wherein the support base is a GaN support base.

12. The nitride semiconductor light emitting device according to claim 1, wherein the support base is a $Ga_ZAl_{1-Z}N$ (where Z is not less than 0 and is less than 1) support base, a bandgap energy of the first conductivity type nitride semiconductor layer is larger than an energy corresponding to a wavelength component of the light from the active region, the $Ga_ZAl_{1-Z}N$ support base has a first surface and a second surface, the first conductivity type nitride semiconductor layer, the active region and the second conductivity type nitride semiconductor layer are mounted on the first surface of the $Ga_ZAl_{1-Z}N$ support base, and the light from the active region is emitted through the second surface of the $Ga_ZAl_{1-Z}N$ support base.

13. The nitride semiconductor light emitting device according to claim 10, wherein the support base is an AlN support base.

14. The nitride semiconductor light emitting device according to claim 1, wherein the support base is a metal support base, the first conductivity type nitride semiconductor layer, the active region and the second conductivity type nitride semiconductor layer are mounted on a surface of the metal support base, and a bandgap energy of the first conductivity type nitride semiconductor layer is larger than an energy corresponding to a wavelength component of light from the active region.

15. The nitride semiconductor light emitting device according to claim 1, wherein a bandgap energy of the $In_{X2}Al_{Y2}Ga_{1-X2-Y2}N$ barrier layer is substantially equal to a bandgap energy of the $In_{X3}Al_{Y3}Ga_{1-X3-Y3}N$ buffer layer.

* * * * *